: US 9,485,865 B2
(45) Date of Patent: Nov. 1, 2016

(12) United States Patent
Higashikawa et al.

(54) SUBSTRATE SPACING MEMBER AND INVERTER DEVICE

(71) Applicant: KABUSHIKI KAISHA TOYOTA JIDOSHOKKI, Kariya-shi, Aichi (JP)

(72) Inventors: Naoki Higashikawa, Kariya (JP); Kazuyoshi Kontani, Kariya (JP)

(73) Assignee: KABUSHIKI KAISHA TOYOTA JIDOSHOKKI, Kariya-shi, Aichi (JP)

(*) Notice: Subject to any disclaimer, the term of this patent is extended or adjusted under 35 U.S.C. 154(b) by 138 days.

(21) Appl. No.: 14/220,683

(22) Filed: Mar. 20, 2014

(65) Prior Publication Data
US 2014/0285974 A1    Sep. 25, 2014

(30) Foreign Application Priority Data

Mar. 21, 2013 (JP) ................ 2013-058574

(51) Int. Cl.
H05K 1/14 (2006.01)
H05K 1/02 (2006.01)
H05K 7/14 (2006.01)

(52) U.S. Cl.
CPC ............ H05K 1/144 (2013.01); H05K 1/0203 (2013.01); H05K 7/142 (2013.01); H05K 2201/041 (2013.01)

(58) Field of Classification Search
CPC .... H05K 1/0203; H05K 1/144; H05K 1/041; H05K 1/142; H05K 2201/2018; H05K 2201/10424
USPC ................................. 361/707, 709
See application file for complete search history.

(56) References Cited

U.S. PATENT DOCUMENTS

| 4,908,738 A | 3/1990 | Kobari et al. |
| 7,248,483 B2* | 7/2007 | West ..................... H02M 7/003 361/756 |
| 7,663,886 B2* | 2/2010 | Aoki ....................... H01L 23/24 257/678 |
| 7,733,650 B2* | 6/2010 | Okayama .............. H01L 25/162 165/185 |

FOREIGN PATENT DOCUMENTS

| CN | 101523597 A | 9/2009 |
| JP | 03159192 A | 7/1991 |
| JP | 04-044190 Y * | 4/1992 |
| JP | 0444190 U | 4/1992 |

(Continued)

OTHER PUBLICATIONS

Translation of JP 04-044190 Y provided by Applicant, Name Wakamatsu, available in EDAN.*
Communication dated Jan. 6, 2015, issued by the Japanese Patent Office in counterpart Application No. 2013058574.

(Continued)

Primary Examiner — Tuan T Dinh
Assistant Examiner — Mukund G Patel
(74) Attorney, Agent, or Firm — Sughrue Mion, PLLC

(57) ABSTRACT

A substrate spacing member includes a spacer portion which is disposed between the two substrates in contact with both edge portions thereof to keep a distance between the two substrates constant, spacer member holding portions which hold the spacer members, a frame body portion that connects the spacer member holding portions to each other, a branch portion which extends toward a predetermined position between the two substrates from the frame body portion or the spacer member holding portions, and electrode holding portions which are provided at the branch portions, and hold electrodes at the predetermined positions.

9 Claims, 6 Drawing Sheets

(56) References Cited

FOREIGN PATENT DOCUMENTS

| JP | 2002-344199 A | 11/2002 |
| WO | 2006030606 A1 | 3/2006 |

OTHER PUBLICATIONS

Communication dated Apr. 25, 2016, issued by the State Intellectual Property Office of the P.R.C. in corresponding Chinese Application No. 201410077112.7.

* cited by examiner

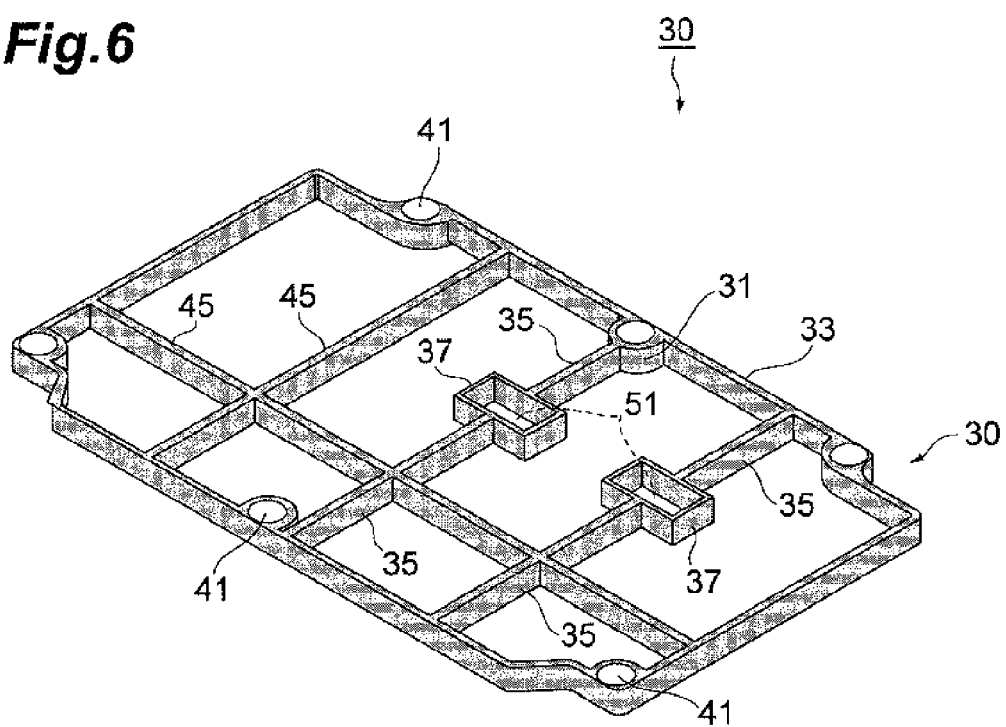

SUBSTRATE SPACING MEMBER AND INVERTER DEVICE

BACKGROUND OF THE INVENTION

1. Field of the Invention

The present invention relates to a substrate spacing member for keeping a space between two substrates, and has an electronic component positioning function, and an inverter device.

2. Related Background Art

As a method for temporarily fixing (positioning and holding) electronic components such as ICs, capacitors, and electrodes at predetermined positions on a substrate, a method using a fixture tool has been generally known. For example, as a method for temporarily fixing a plurality of electronic components at predetermined positions, Patent Literature 1 (Japanese Patent Application Laid-Open No. 2002-344199) has been disclosed. According to Patent Literature 1, a fixture tool having a housing portion in which a plurality of electronic components are collectively housed is prepared, and the electronic components are temporarily fixed by pressing the fixture tool against the substrate side while a plurality of electronic components mounted on a predetermined position on a substrate are housed in the housing portion of the fixture tool (refer to Patent Literature 1).

SUMMARY OF THE INVENTION

However, for example, in a compact inverter device in which a plurality of electronic components are disposed between two substrates held at a predetermined spacing, it is difficult to temporarily fix the electronic components to be disposed between the substrates by use of a pressing-type fixture tool having a housing portion as in the Patent Literature 1. That is, because a space between the substrates becomes narrow according to downsizing of an inverter, and other electronic components are further disposed around the electronic components disposed between the substrates, it is impossible to secure an area from and to which a pressing type fixture tool having a component housing portion is detached and attached. Therefore, a method for temporarily fixing the electronic components on one of the substrates by soldering in advance, and thereafter, disposing the other substrate so as to sandwich the temporarily-fixed electronic components therebetween may be considered. However, the number of processes for solder-joining the electronic components is increased, which causes another problem of increasing the manufacturing cost of the inverter device.

Therefore, an object of the present invention is to provide a substrate spacing member which is capable of easily positioning and holding components to be disposed between two substrates which are held at a predetermined spacing, and an inverter device.

A substrate spacing member according to an aspect of the present invention which is disposed between two substrates on which electronic components are mounted, and keeps a distance between the two substrates constant, the substrate spacing member includes a spacer portion which is disposed between the two substrates in contact with both edge portions thereof to keep a distance between the two substrates constant, a frame body portion that connects the spacer portions together, a branch portion which extends toward a predetermined position between the two substrates from the frame body portion or the spacer portion, and a branch holding portion which is provided at the branch portion, and holds a component at the predetermined position.

According to this substrate spacing member, positioning of the component with respect to the substrates is completed by only inserting a component into the branch holding portion, and disposing the spacer portion for keeping a space between the two substrates at the predetermined position. Thereby, it is possible to easily position the component at the predetermined position even without use of soldering or a tool.

In addition, the term "components" here includes capacitors, resistors, switching elements, substrates, electrodes, wiring busbars, heat radiating sheets, and the like serving as components composing electric equipment such as an inverter.

The branch holding portion may have a first branch holding portion which holds the component at the predetermined position, and a second branch holding portion which holds a component around the first branch holding portion.

According to this substrate spacing member, it is possible to temporarily fix components which are disposed around the first branch holding portion by the second branch holding portion provided adjacent to the first branch holding portion.

The frame body portion is formed into a frame form along circumferential edge portions of the substrates, and the substrate spacing member may further have a frame body holding portion which is provided at the frame body portion, and holds the component.

According to this substrate spacing member, because it is possible to temporarily fix components to the circumferential edge portions of the substrates, it is possible to improve the degree of freedom of layout of the components.

The frame body holding portion may have a first frame body holding portion which holds the component, and a second frame body holding portion which holds a component around the first frame body holding portion.

According to this substrate spacing member, it is possible to temporarily fix components to be disposed around the first frame body holding portion by the second frame body holding portion which is provided adjacent to the first frame body holding portion.

The spacer portion has a spacer member and a spacer member holding portion which holds the spacer member, and the spacer member held by the spacer member holding portion has conductive properties, and includes a through hole into which a screw is able to be inserted, and the spacer member holding portion may be formed of an insulating body.

According to this substrate spacing member, it is possible to ground the other substrate via the spacer member by grounding one of the substrates. Further, it is possible to easily fix the two substrates on a heat sink by inserting a screw into the through hole of the spacer member.

An inverter device according to an aspect of the present invention includes a heat sink, a metal substrate which is placed on the heat sink, and on which switching elements are mounted, a capacitor substrate which is disposed so as to face the metal substrate, and on which capacitors are mounted, an electrode which is disposed between the metal substrate and the capacitor substrate, and which electrically connects the metal substrate and the capacitor substrate, and the above-described substrate spacing member, the inverter device in which the electrode is held by the branch holding portion included in the substrate spacing member.

According to the present invention, it is possible to easily position and hold (temporarily fix) a component to be disposed between the two substrates which are held at a predetermined spacing.

BRIEF DESCRIPTION OF THE DRAWINGS

FIG. 6 is a perspective view showing a substrate spacing member according to yet another embodiment.

DESCRIPTION OF THE PREFERRED EMBODIMENTS

Figure 1:
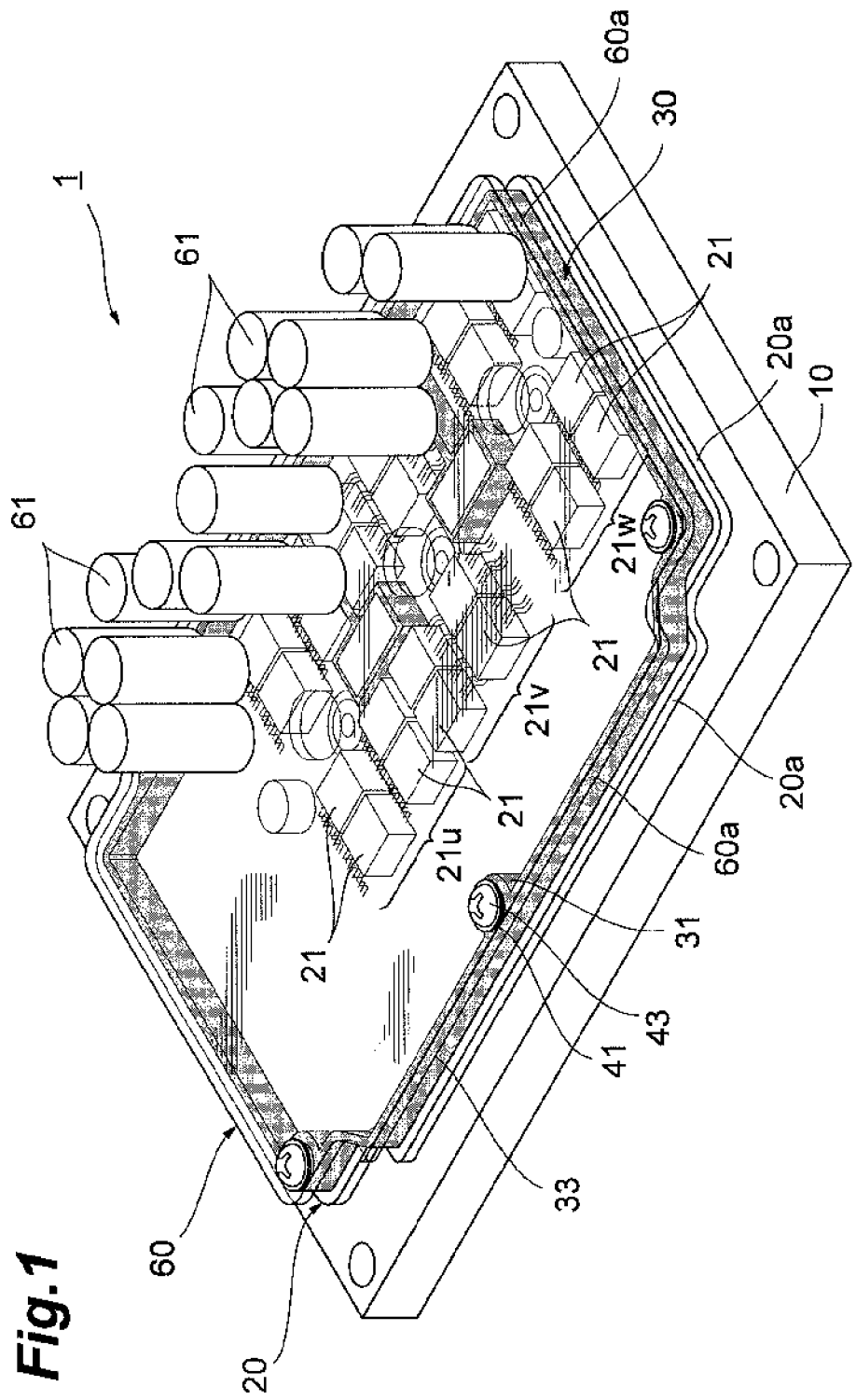
FIG. 1 is a perspective view showing an inverter device including a substrate spacing member according to an embodiment.

Hereinafter, an embodiment will be described in detail with reference to the drawings. In addition, the same or corresponding portions in the respective drawings are shown with the same symbols. The dimensional ratios in the drawings are not necessarily proportional to those in the description. In the description, the words referring to directions such as "upper" and "lower" are expedient words based on the states shown in the drawings.

Figure 2:
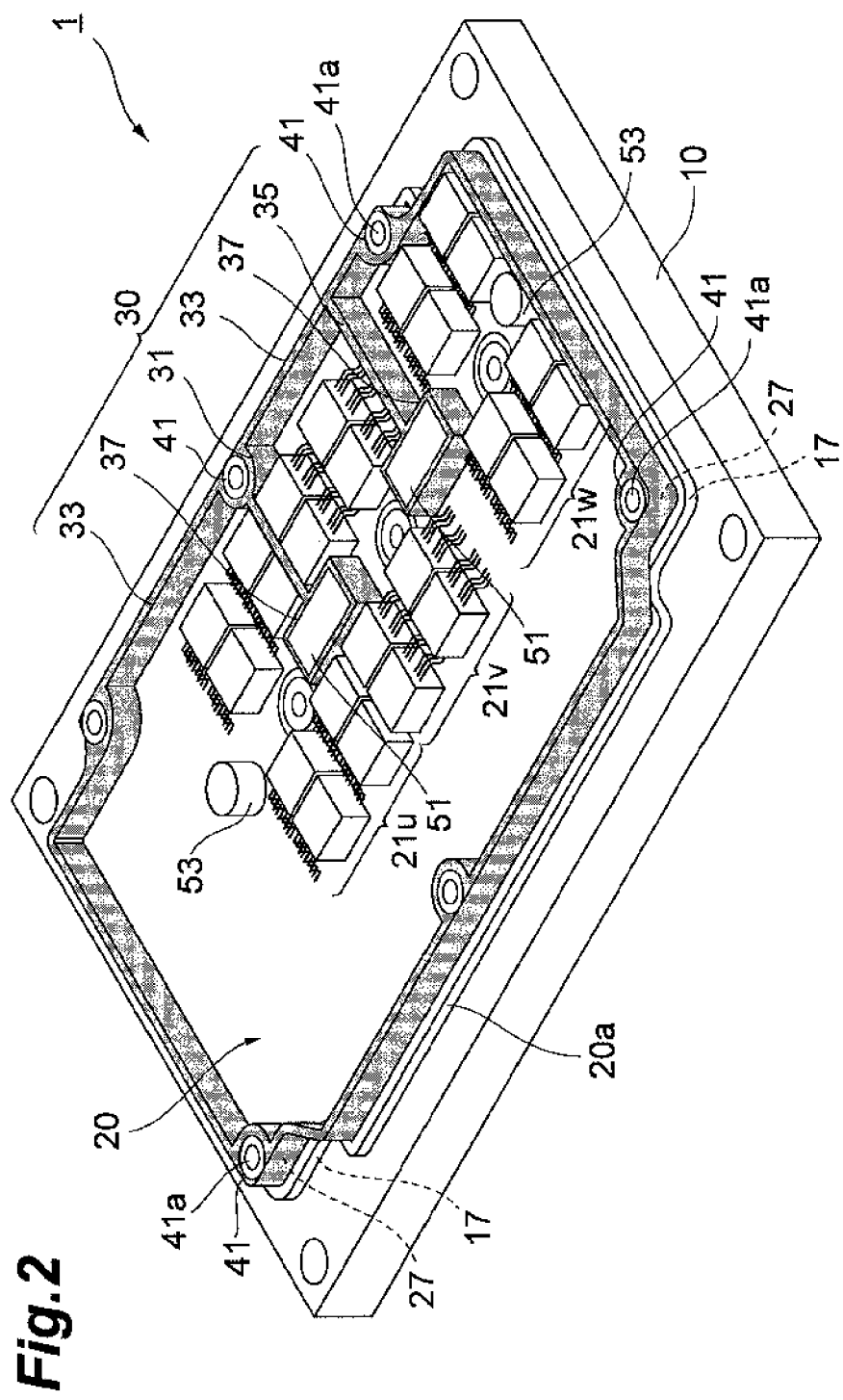
FIG. 2 is a perspective view showing a state in which a capacitor substrate on which capacitors are disposed is removed from the inverter device shown in FIG. 1.

FIG. 1 is a perspective view showing an inverter device including a substrate spacing member according to an embodiment. In FIG. 1, in order to show the layout state of MOS transistors 21 and the like which are disposed under a capacitor substrate 60, the capacitor substrate 60 is shown in a transparent state. FIG. 2 is a perspective view showing a state in which the capacitor substrate 60 on which capacitors 61 are arranged and mounted is removed from the inverter device shown in FIG. 1.

An inverter device 1 is a so-called three-phase inverter that outputs a three-phase (u/v/w phases) alternating current, and drives a cargo handling motor and a traction motor of a forklift, for example. The inverter device 1 mainly includes a heat sink 10, a metal substrate 20 on which the MOS (Metal-Oxide-Semiconductor) transistors 21 are mounted, a substrate spacing member 30, spacer members 41, electrodes (components) 51, and the capacitor substrate 60 on which the capacitors 61 are mounted.

The heat sink 10 is a member which lowers temperature by a diffusion action of heat generated in power conversion, and the metal substrate 20 is placed thereon. The heat transmitted to the heat sink 10 from the MOS transistors 21 and the like mounted on the metal substrate 20 is diffused from fins or the like formed on the surface of the heat sink. For the heat sink 10, metal such as aluminum, copper, or the like with high thermal conductivity is used. Through holes 27 and 67 (refer to FIG. 3A and FIG. 4) of the metal substrate 20 and the capacitor substrate 60, and screw holes 17 into which screws 43 to be inserted into the spacer members 41 are screwed are formed in the vicinity of the circumferential edge portions of the heat sink 10.

As switching elements, for example, the MOS transistors 21 are mounted on the metal substrate 20. In the MOS transistors 21, transistor groups 21u, 21v, and 21w are respectively formed for the u phase, the v phase, and the w phase. The MOS transistors 21 and the electrodes 51 are disposed in consideration of low-inductance, electric current balance, and the like. The through holes 27 into which the screws 43 which will be described later are inserted are formed in a circumferential edge portion 20a of the metal substrate 20.

The spacer members 41 are members for keeping a space between the metal substrate 20 and the capacitor substrate 60 at a predetermined spacing. The spacer members 41 are disposed in the vicinity of the circumferential edge portions 20a and 60a of the metal substrate 20 and the capacitor substrate 60. The spacer members 41 have through holes 41a into which the screws 43 for fastening the metal substrate 20 and the capacitor substrate 60 to the heat sink 10 are inserted.

The substrate spacing member 30 is a member for positioning and holding the spacer members 41 at predetermined positions at the time of tightening the spacer members 41 to be sandwiched between the metal substrate 20 and the capacitor substrate 60 together. Further, the substrate spacing member 30 has a function of positioning and holding the electrodes 51 serving as components disposed between the both substrates at predetermined positions. The substrate spacing member 30 is formed of an insulating member. As an insulating member, for example, resin, ceramic, or the like is used. The substrate spacing member 30 has spacer member holding portions 31, a frame body portion 33, branch portions 35, and electrode holding portions (branch holding portions) 37.

The spacer member holding portions 31 are portions for holding the spacer members 41. A plurality of the spacer member holding portions 31 are formed. In the substrate spacing member 30 of the present embodiment, the spacer member holding portions 31 are formed by two pairs of three, that is, six in total, along the long side direction. The spacer member holding portions 31 are formed according to the number and the layout positions of the spacer members 41 which are appropriately determined in consideration of the sizes and the like of the metal substrate 20 and the capacitor substrate 60.

The frame body portion 33 is a portion which connects the plurality of spacer member holding portions 31 together, and is formed into a frame form along the circumferential edge portions 20a and 60a of the metal substrate 20 and the capacitor substrate 60.

The branch portions 35 are portions which extend from the frame body portion 33 or the spacer member holding portions 31 up to the above-described predetermined positions when the spacer members 41 are held by the spacer member holding portions 31. In the substrate spacing member 30 of the present embodiment, the two branch portions 35 are formed. One of the branch portions 35 is formed so as to extend from the spacer member holding portion 31 up to an attaching position of the electrode 51 between the metal substrate 20 and the capacitor substrate 60. The other branch portions 35 are formed so as to extend from the frame body portion 33 up to an attaching position of the electrode 51 between the metal substrate 20 and the capacitor substrate 60.

The electrode holding portions 37 are portions which are provided at the tip ends of the branch portions 35, and hold the electrodes 51 at the attaching positions of the electrodes 51 between the metal substrate 20 and the capacitor substrate 60. In the substrate spacing member 30 of the present embodiment, the two electrode holding portions 37 are provided. The electrodes 51 are inserted into the electrode holding portions 37.

The electrodes 51 form electric pathways between the metal substrate 20 and the capacitor substrate 60. The electrodes 51 are formed of current-carrying materials. Examples of the current-carrying materials include aluminum, brass, and the like. Further, plate processing may be applied to the electrodes 51. Positions (attaching positions) at which the electrodes 51 are disposed between the metal substrate 20 and the capacitor substrate 60 are determined in consideration of inductance, electric current balance, and the like of the inverter device 1. According to downsizing of the inverter device 1, the electrodes 51 are disposed in the central portions of the transistor groups composed of the plurality of MOS transistors 21 which are connected sequentially.

The capacitors 61 are mounted on the capacitor substrate 60. The through holes 67 into which the spacer members 41 are inserted are formed in the vicinity of the circumferential edge portion 60a of the capacitor substrate 60.

The metal substrate 20 and the capacitor substrate 60 are fastened to the heat sink 10 with the screws 43 so as to be at a predetermined spacing with the spacer members 41. The screws 43 are inserted into the through holes 67, the spacer members 41, and the through holes 27. The screws 43 are inserted from the side of the capacitor substrate 60, to be screwed into the screw holes 17 of the heat sink 10.

Figure 3A:
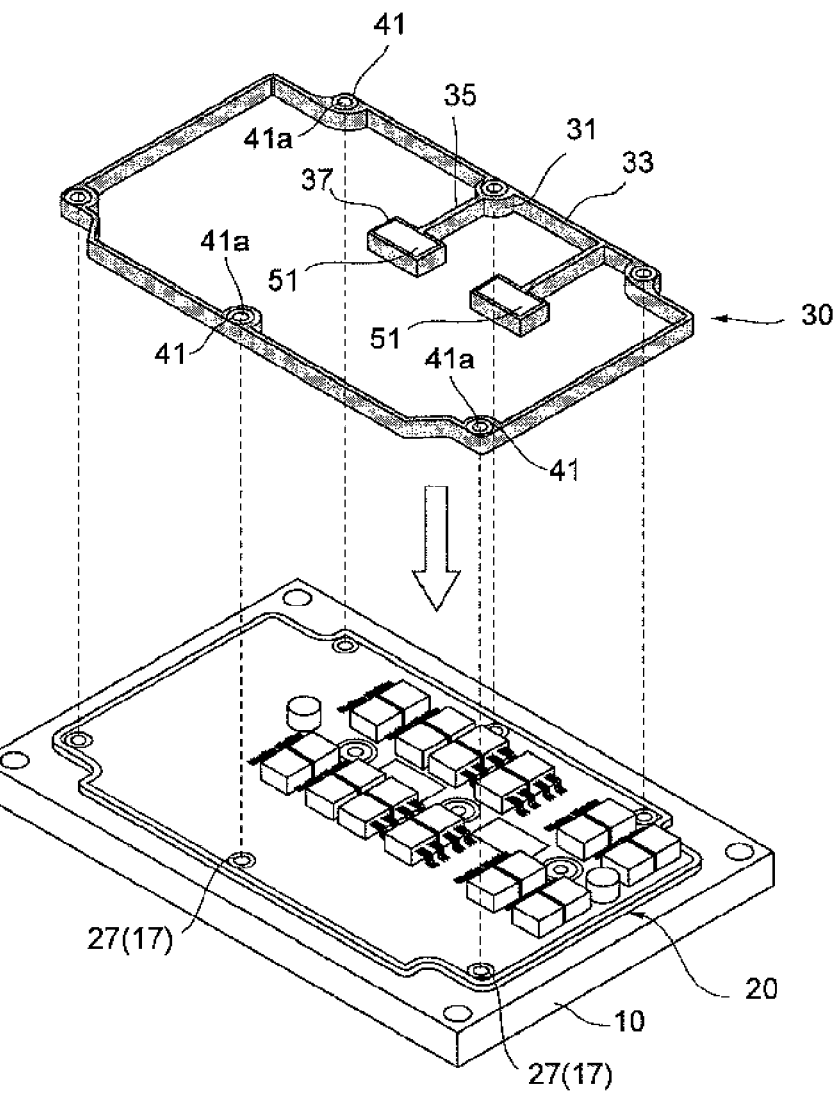
FIGS. 3A and 3B are drawings showing an embodiment of an assembling method of the inverter device.
Figure 3B:
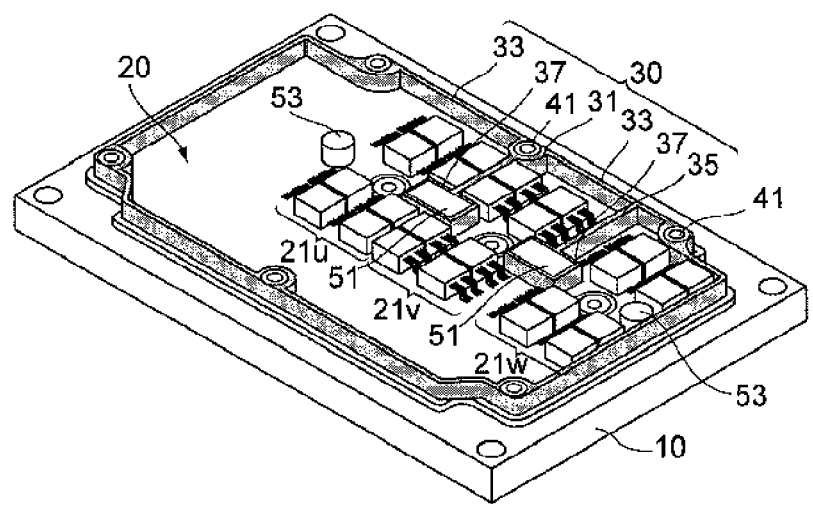
Figure 4:
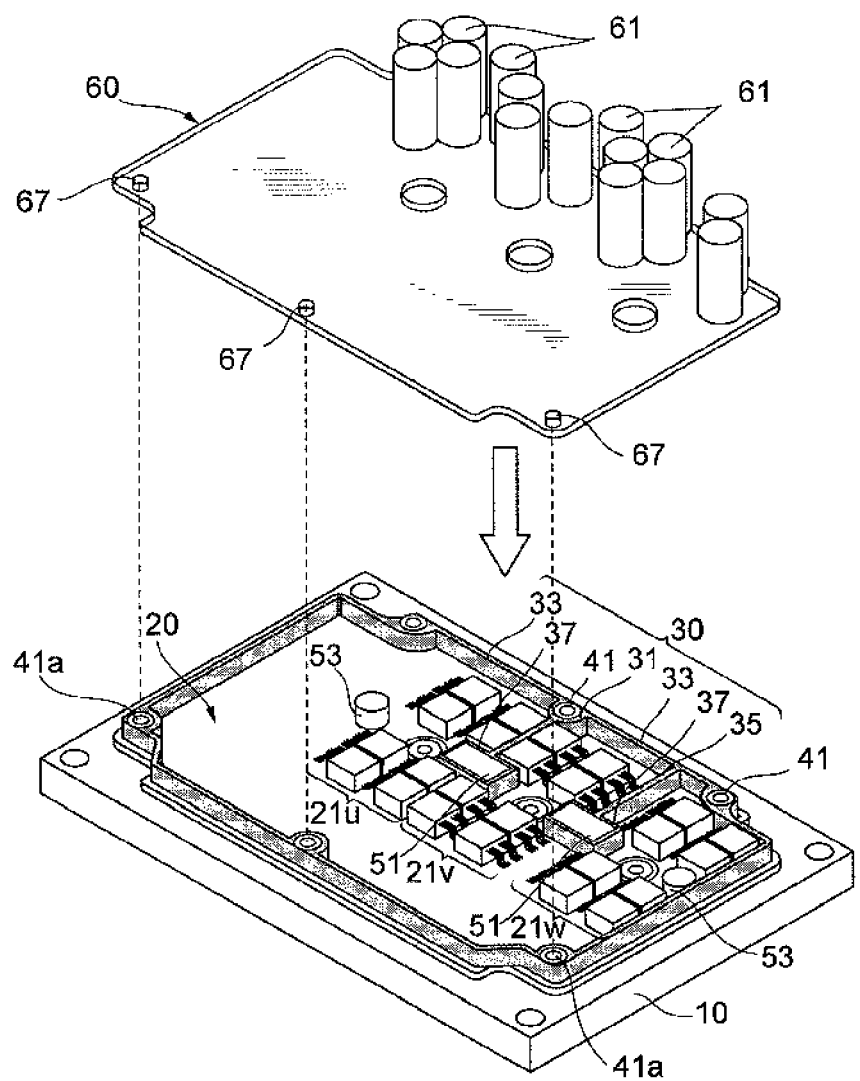
FIG. 4 is a drawing showing an embodiment of an assembling method of the inverter device.

Next, an assembling method of the inverter device 1 will be described by use of FIGS. 3A and 3B, and FIG. 4. FIGS. 3A and 3B, and FIG. 4 are diagrams showing an embodiment of an assembling method of the inverter device 1.

First, as shown in FIG. 3A, the metal substrate 20 is placed on the heat sink 10. At this time, alignment is performed such that the positions of the screw holes 17 of the heat sink 10 and the positions of the through holes 27 of the metal substrate 20 are matched to one another.

Next, the electrodes 51 are inserted into the electrode holding portions 37, and further, the substrate spacing member 30 in which the spacer members 41 are held by the spacer member holding portions 31 is prepared. Then, the substrate spacing member 30 holding the spacer members 41 and the electrodes 51 is placed on the metal substrate 20 (refer to FIG. 3B). At this time, alignment is performed such that the positions of the through holes 41a of the spacer members 41 and the positions of the through holes 27 of the metal substrate are matched to one another.

This substrate spacing member 30 is formed such that the electrode holding portions 37 are disposed on the above-described predetermined positions when the substrate spacing member 30 is placed on the metal substrate 20 such that the spacer member holding portions 31 are matched to the layout positions of the spacer members 41 on the metal substrate 20, i.e., the layout positions of the through holes 27 of the metal substrate 20. Therefore, provided that the substrate spacing member 30 in a state in which the electrodes 51 are held by the electrode holding portions 37 is prepared, and is mounted such that the positions of the spacer member holding portions 31 of the substrate spacing member 30 are matched to the through holes 27 on the metal substrate 20, the electrodes 51 are positioned and held at desired positions intended to be fixed between the metal substrate 20 and the capacitor substrate 60.

Next, as shown in FIG. 4, the capacitor substrate 60 is mounted on the metal substrate 20 in which the electrodes 51 are positioned and held by the substrate spacing member 30. At this time, alignment is performed such that the positions of the through holes 67 of the capacitor substrate 60 and the positions of the through holes 41a of the spacer members 41 are matched to one another.

Next, the screws 43 are inserted into the through holes 67 of the capacitor substrate 60, the through holes 41a of the spacer members 41, and the through holes 27 of the metal substrate 20, to be screwed into the screw holes 17 provided in the heat sink 10. Accordingly, the electrodes 51 and the spacer members 41 are tightened together by the metal substrate 20 and the capacitor substrate 60. Then, components such as an input terminal which are not shown in the drawings are attached, which completes the inverter device 1 as shown in FIG. 1.

The substrate spacing member 30 of the above-described embodiment is formed such that the electrode holding portions 37 are capable of holding the electrodes 51 which are rectangular in planar view.

Although one embodiment has been described above, the present invention is not limited to the above-described embodiment, and various modifications are possible within the scope without departing from the spirit of the invention.

In the above embodiment, the electrodes 51 have been described as an example of components which are positioned and held by the substrate spacing member 30. However, the present invention is not limited to this example. For example, capacitors, resistors, switching elements, substrates, wiring busbars, heat radiating sheets, and the like may serve as components composing electric equipment such as an inverter.

The substrate spacing member 30 of the above-described embodiment has been described by use of the example in which the spacer member holding portions 31 and the spacer members 41 are respectively configured as separate components. However, the present invention is not limited to this example, and the spacer member holding portions 31 and the spacer members 41 may be configured as one member (a spacer portion).

The substrate spacing member 30 of the above-described embodiment has been described by use of the example of the branch portions 35 of a shape extending from the spacer member holding portions 31 or the frame body portion 33 up to the attaching position of the electrodes 51 as shown in FIG. 2. However, the present invention is not limited this example.

Figure 5:
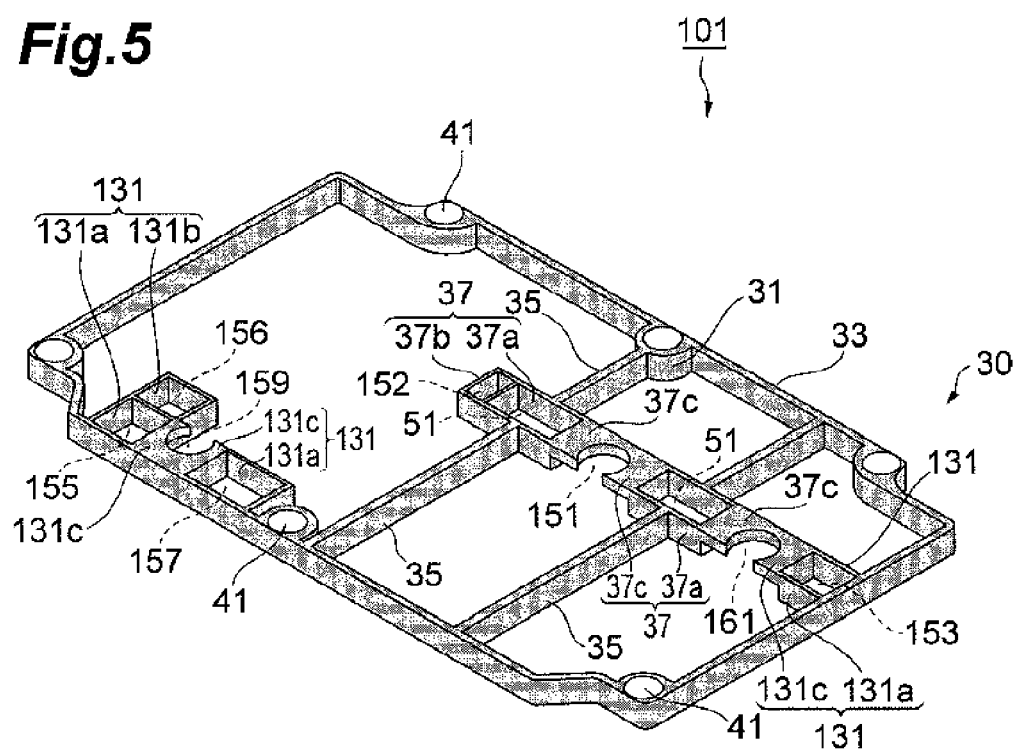
FIG. 5 is a perspective view showing a substrate spacing member according to another embodiment.

For example, as shown in FIG. 5, the branch holding portion 37 may have a first branch holding portion 37a which holds the component 51 at the predetermined position, and a second branch holding portion 37b which holds a component 152 around the first branch holding portion 37a.

Further, for example, as shown in FIG. 5, the branch holding portion 37 may have a second branch holding portion 37c which extends toward the adjacent branch holding portion 37, and holds a component 151 around the first branch holding portion 37a. Here, the adjacent branch holding portion 37 has the second branch holding portion 37c with the same configuration, thereby, it is possible to hold the component 151 around the first branch holding portion 37a. In addition, FIG. 5 shows the example in which the second branch holding portions 37c adjacent to one another are integrally formed. However, it may be a configuration in which those are spaced from each other.

The second branch holding portions 37b and 37c extending from the first branch holding portion 37a may be integrated with the first branch holding portion 37a, or may be separated from the first branch holding portion 37a.

According to this configuration of the substrate spacing member 30, it is possible to position and hold the components 151 and 152 disposed around the first branch holding portion 37a. Therefore, there is no need to provide a new branch portion and branch holding portion for holding there components 151 and 152.

Further, for example, as shown in FIG. 5, the frame body portion 33 may be formed into a frame form along the circumferential edge portions of the metal substrate (substrate) 20 and the capacitor substrate (substrate) 60, and the substrate spacing member 30 may further include a frame body holding portion 131 which is provided at the frame body portion 33, and holds a component 153 (155, 157). According to this configuration of the substrate spacing member 30, it is possible to position and hold the components 153 (155, 157) at the circumferential edge portions of the metal substrate 20 and the capacitor substrate 60 as well. Therefore, it is possible to improve the degree of freedom of layout of the components.

Further, for example, as shown in FIG. 5, the frame body holding portion 131 may have a first frame body holding portion 131a which holds the component 155 at a predetermined position, and a second frame body holding portion 131b which holds a component 156 around the first frame body holding portion 131a.

Further, for example, as shown in FIG. 5, the frame body holding portion 131 which holds the component 155 may have a second frame body holding portion 131c which extends toward the adjacent frame body holding portion 131, and holds a component 159 around the first frame body holding portion 131a. Here, the adjacent frame body holding portion 131 has the second frame body holding portion 131c with the same configuration, thereby, it is possible to hold the component 159 around the first frame body holding portion 131a. In addition, FIG. 5 shows the example in which the second frame body holding portions 131c adjacent to one another are integrally formed. However, it may be a configuration in which those are spaced from each other.

The second frame body holding portions 131b and 131c extending from the first frame body holding portion 131a may be integrated with the first frame body holding portion 131a, or may be separated from the first frame body holding portion 131a.

According to this configuration of the substrate spacing member 30, it is possible to position and hold the components 156 and 159 disposed around the first frame body holding portion 131a. Therefore, there is no need to provide a new frame body holding portion 131 for holding there components 156 and 159.

Moreover, for example, as shown in FIG. 5, the branch holding portion 37 may have the second branch holding portion 37c which extends toward the adjacent frame body holding portion 131, and holds a component 161 around the first branch holding portion 37a. Here, the adjacent frame body holding portion 131 has the second frame body holding portion 131c with the same configuration, thereby, it is possible to hold the component 161 around the first branch holding portion 37a. In addition, FIG. 5 shows the example in which the second branch holding portion 37c and the second frame body holding portion 131c adjacent to one another are integrally formed. However, it may be a configuration in which those are spaced from each other.

The second branch holding portion 37c extending from the first branch holding portion 37a may be integrated with the first branch holding portion 37a, or may be separated from the first branch holding portion 37a. The second frame body holding portion 131c extending from the first frame body holding portion 131a may be integrated with, or may be separated from the first frame body holding portion 131a.

According to this configuration of the substrate spacing member 30, it is possible to position and hold the component 161 disposed around the first branch holding portion 37a. Therefore, there is no need to provide the new branch holding portion 37 for holding this component 161.

Further, for example, as shown in FIGS. 5 and 6, the branch portions 35 may be provided so as to connect the spacer member holding portions 31 or the frame body portion 33 provided on one of the long sides and the spacer member holding portions 31 or the frame body portion 33 provided at the opposite position. In other words, the branch portions 35 may be formed in a grid pattern. Accordingly, it is possible to improve the accuracy of position at the time of positioning and holding the components 51 at predetermined positions on the metal substrate 20.

Moreover, as shown in FIG. 6, the substrate spacing member 30 may include a connection portion 45 for directly connecting the frame body portion 33 and the frame body portion 33. Accordingly, it is possible to maintain the shape of the substrate spacing member 30, and it is possible to position and hold a target component at a more precise position.

The inverter device 1 of the above-described embodiment has been described by use of the example in which the screws 43 are inserted into the through holes 67 of the capacitor substrate 60, the through holes 41a of the spacer members 41, and the through holes 27 of the metal substrate 20 from the capacitor substrate 60 side, to be screwed into the screw holes 17 provided in the heat sink 10, thereby tightening the electrodes 51 and the spacer members 41 together by the metal substrate 20 and the capacitor substrate 60. However, it is not limited to this example.

For example, through holes may be respectively provided at positions of the metal substrate 20 and the capacitor substrate 60 which correspond to the position at which the electrodes 51 are disposed, through holes may be provided in the electrodes 51, and screw holes may be provided at positions of the heat sink 10 which correspond to the positions. Accordingly, because the screws are able to be inserted into the through holes of the capacitor substrate, the through holes of the electrodes, and the through holes of the metal substrate from the capacitor substrate 60 side, to be screwed into the screw holes in the heat sink, it is possible to tighten the electrodes 51 and the spacer members 41 together by the metal substrate 20 and the capacitor substrate 60.

Further, with the configuration in which it is possible to fix the spacer members 41 to the heat sink 10, it is possible to fix the spacer members 41 in a state in which the metal substrate 20 is mounted on the heat sink 10, and dispose the substrate spacing member 30 so as to hold the spacer members 41. In this way, it is possible to improve the accuracy of position at the time of positioning and holding the electrodes 51 between the metal substrate 20 and the capacitor substrate 60. In addition, as a configuration in which the spacer members 41 are fixed to the heat sink 10, a configuration in which a screw groove may be provided in the edge portion of the spacer member 41, so as to be able to be screwed into the screw hole 17 provided in the heat sink 10 may be adopted, or a fit-in portion to be fit into the screw hole 17 may be provided at the edge portion of the spacer member 41.

Further, claw portions for positioning the substrate spacing member 30 at a predetermined position on the metal substrate 20 may be provided at the spacer member holding portions 31 and the frame body portion 33, or the like. Even in such a case, it is possible to improve the accuracy of position at the time of positioning and holding the electrodes 51 on the metal substrate 20.

In the above-described embodiment, the example in which the spacer member 41 and the electrode 51 are respectively inserted into (pressed into) the spacer member holding portion 31 and the electrode holding portion 37 has been described. However, the spacer member 41 and the spacer member holding portion 31 may be integrally formed, or the electrode 51 and the electrode holding portion 37 may be integrally formed.

The substrate spacing member 30 of the above-described embodiment has been described by use of the example in which the electrode holding portions 37 are formed so as to be capable of holding the electrodes 51 which are rectangular in planar view. However, it is not limited to this example. The holding portions 37 may be formed so as to be capable of holding the electrodes 51 which are circular, oval, or polygonal in planar view.

Further, the thicknesses in the laminating direction of the both substrates 20 and 60 in the spacer member holding portions 31, the frame body portion 33, the branch portions 35, and the electrode holding portions 37 may be shorter than the spacer members 41 and the electrodes 51. That is, there is no need to have a function of keeping a distance between the metal substrate 20 and the capacitor substrate 60 constant.

What is claimed is:

1. A substrate spacing member which is disposed between two substrates on which electronic components are mounted, and keeps a distance between the two substrates constant, the substrate spacing member comprising:
    one or more spacer portions which are disposed between the two substrates in contact with both edge portions thereof, to keep a distance between the two substrates constant;
    a frame body portion that connects the spacer portions together;
    a branch portion which extends toward a predetermined position between the two substrates from the frame body portion or the spacer portion;
    a conductive component;
    a branch holding portion which is provided at the branch portion, the branch holding portion configured to hold the conductive component before assembly with the substrates, wherein
    a spacer portion of the one or more spacer portions has a spacer member and a spacer member holding portion which holds the spacer member, and the spacer member held by the spacer member holding portion has conductive properties, and includes a through hole into which a screw is able to be inserted, and
    the spacer member holding portion is formed of an insulating body; and
    a heat sink;
    wherein the two substrates are comprised of a metal substrate and a capacitor substrate;
    the metal substrate is mounted on the heat sink, and switching elements are mounted on the metal substrate;
    the capacitor substrate is disposed so as to face the metal substrate, capacitors being mounted on the capacitor substrate; and
    the conductive component is comprised of an electrode and is disposed between the metal substrate and the capacitor substrate, and electrically connects the metal substrate and the capacitor substrate.

2. The substrate spacing member according to claim 1, wherein the branch holding portion has a first branch holding portion which holds the conductive component at the predetermined position, and a second branch holding portion which holds a second conductive component around the first branch holding portion.

3. The substrate spacing member according to claim 1, wherein
    the frame body portion is formed into a frame form along circumferential edge portions of the substrates, and
    the substrate spacing member further has a frame body holding portion which is provided at the frame body portion, and holds the conductive component.

4. The substrate spacing member according to claim 3, wherein the frame body holding portion has a first frame body holding portion which holds the conductive component, and a second frame body holding portion which holds a second conductive component around the first frame body holding portion.

5. The substrate spacing member according to claim 1, wherein
    the branch holding portion surrounds a peripheral surface of the conductive component and has a wall surface in contact with the peripheral surface; and
    the peripheral surface of the conductive component is orthogonal to the opposing direction of the two substrates.

6. The substrate spacing member according to claim 1, wherein
    the branch holding portion holds the conductive component so as to press into the conductive component.

7. The substrate spacing member according to claim 1, wherein the branch holding portion is further configured to position the conductive component at a predetermined position relative to the metal substrate and the capacitor substrate.

8. The substrate spacing member according to claim 1, wherein the conductive component forms an electric pathway between the metal substrate and the capacitor substrate.

9. A method of producing an inverter device, the method comprising:
    preparing a first substrate and a second substrate, a component positioned at a predetermined position between the first substrate and the second substrate, and a substrate spacing member;
    wherein the substrate spacing member comprises:
    one or more spacer portions which are disposed between the first substrate and the second substrate in contact with both edge portions thereof, to keep a distance between the first substrate and the second substrate constant;
    a frame body portion that connects the spacer portions together;
    a branch portion which extends toward a predetermined position between the first substrate and the second substrate from the frame body portion or the spacer portion;
    a conductive component;
    a branch holding portion which is provided at the branch portion, directly holds the conductive component at the predetermined position, and positions the conductive component at the predetermined position relative to the first substrate and the second substrate;

the method further comprising:

causing the branch holding portion of the substrate spacing member to hold the conductive component before assembly with the substrates;

positioning the conductive component relative to the first substrate by disposing the spacer portion of the substrate spacing member holding the conductive component at a specified position of the first substrate; and securing the component by sandwiching the substrate spacing member disposed on the first substrate with the second substrate, wherein a spacer portion of the one or more spacer portions has a spacer member and a spacer member holding portion which holds the spacer member, and the spacer member held by the spacer member holding portion has conductive properties, and includes a through hole into which a screw is able to be inserted, and the spacer member holding portion is formed of an insulating body; and a heat sink;

wherein the two substrates are comprised of a metal substrate and a capacitor substrate;

the metal substrate is mounted on the heat sink, and switching elements are mounted on the metal substrate;

the capacitor substrate is disposed so as to face the metal substrate, capacitors being mounted on the capacitor substrate; and the conductive component is comprised of an electrode and is disposed between the metal substrate and the capacitor substrate, and electrically connects the metal substrate and the capacitor substrate.

* * * * *